(12) United States Patent
Rarick

(10) Patent No.: US 6,768,684 B2
(45) Date of Patent: Jul. 27, 2004

(54) SYSTEM AND METHOD FOR SMALL READ ONLY DATA

(75) Inventor: Leonard D. Rarick, San Diego, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/057,172

(22) Filed: Jan. 25, 2002

(65) Prior Publication Data

US 2003/0142555 A1 Jul. 31, 2003

(51) Int. Cl.$^7$ .............................. G11C 7/00; G11C 8/00
(52) U.S. Cl. ........................... 365/189.02; 365/189.08; 365/230.02; 365/230.08
(58) Field of Search .................. 365/189.02, 189.08, 365/230.02, 230.08

(56) References Cited

U.S. PATENT DOCUMENTS

| | | | | |
|---|---|---|---|---|
| 4,764,926 A | * | 8/1988 | Knight et al. ................ 714/733 |
| 4,849,904 A | * | 7/1989 | Aipperspach et al. ......... 716/17 |
| 5,428,579 A | * | 6/1995 | Robinson et al. ....... 365/230.03 |
| 5,557,622 A | * | 9/1996 | Hassoun et al. ............. 714/800 |
| 5,870,431 A | * | 2/1999 | Easton et al. ................ 375/230 |
| 6,452,959 B1 | * | 9/2002 | McDonough ................ 375/130 |
| 2003/0041083 A1 | * | 2/2003 | Jennings et al. ............. 708/622 |
| 2003/0056081 A1 | * | 3/2003 | Leach et al. ................ 711/220 |

* cited by examiner

Primary Examiner—David Nelms
Assistant Examiner—Ly Duy Pham
(74) Attorney, Agent, or Firm—O'Melveny & Myers LLP

(57) ABSTRACT

A system and method is provided for minimizing read-only data retrieval time and/or area through the use of combinatorial logic. In one embodiment of the present invention, two address bits are provided to a binary logic function device. The binary logic function device uses the two address bits and predetermined logic functions (i.e., functions that represent a plurality of read-only data values) to produce a binary value—which is the requested read-only data. In another embodiment, the binary values produced by the binary logic function device are provided to at least one multiplexer. The at least one multiplexer uses at least a portion of the remaining bits (i.e., the address bits not being provided to the binary logic function device) to select (or narrow down) which binary values may be the read-only data requested. If the output of the at least one multiplexer contains more than one binary value, then those values are provided to at least one other multiplexer. The at least one other multiplexer uses the remainder of the remaining bits to select which binary value is the read-only data requested.

2 Claims, 8 Drawing Sheets

FIG. 3

| x,y | a | b | c | d | e | f | g | h | i | j | k | l | m | n | p | q |
|---|---|---|---|---|---|---|---|---|---|---|---|---|---|---|---|---|
| 0 0 | 0 | 0 | 0 | 0 | 0 | 0 | 0 | 0 | 1 | 1 | 1 | 1 | 1 | 1 | 1 | 1 |
| 0 1 | 0 | 0 | 0 | 0 | 1 | 1 | 1 | 1 | 0 | 0 | 0 | 0 | 1 | 1 | 1 | 1 |
| 1 0 | 0 | 0 | 1 | 1 | 0 | 0 | 1 | 1 | 0 | 0 | 1 | 1 | 0 | 0 | 1 | 1 |
| 1 1 | 0 | 1 | 0 | 1 | 0 | 1 | 0 | 1 | 1 | 0 | 1 | 0 | 1 | 0 | 1 | 1 |

FIG. 4

| x,y | READ-ONLY DATA | BINARY REPRESENTATION |
|---|---|---|
| 0,0 | 20 | 01 0100 |
| 0,1 | 32 | 10 0000 |
| 1,0 | 16 | 01 0000 |
| 1,1 | 4  | 00 0100 | ek ajaa

FIG. 5

| x,y | READ ONLY DATA | S | EXP | | BN | FRACTION | | | | |
|---|---|---|---|---|---|---|---|---|---|---|
| 00 | ONE | 0 | 0111 | 1111 | 1 | 0000 | 0000 | 0000 | 0000 | 000 |
| 01 | lg 10 | 0 | 1000 | 0000 | 1 | 1010 | 1001 | 0000 | 1111 | 000 |
| 10 | lg e | 0 | 0111 | 1111 | 1 | 0111 | 0001 | 0011 | 0111 | 011 |
| 11 | pi | 0 | 1000 | 0001 | 1 | 1001 | 0010 | 0001 | 1011 | 011 |
| a | fkkk | kkk1 | – | fcgd | eabg | aceh | bhbb | fghh | add |

510 520 530 540 550 560 570

| x,y | READ ONLY DATA | S | EXP | D | FRACTION | | | |
|---|---|---|---|---|---|---|---|---|
| 00 | log 2 | 0 | 0111 1101 | 1 | 0011 | 0100 0100 | 0001 0011 | 011 |
| 01 | ln 2 | 0 | 0111 1110 | 1 | 0110 | 0010 1110 | 0100 0011 | 000 |
| 10 | Zero | 0 | 0000 0000 | 0 | 0000 | 0000 0000 | 0000 0000 | 000 |
| 11 | DC | 1 | 1111 1111 | 1 | 1100 | 0000 0000 | 0000 0000 | 000 |
| | | b | bnnn nnnj | – | bfmi | aiea emea | aeai aamm | aii |

| Address | Read-only Data |
|---|---|
| 000 | one |
| 001 | lg 10 |
| 010 | lg e |
| 011 | pi |
| 100 | log 2 |
| 101 | ln 2 |
| 110 | Zero |
| 111 | DC |

710 = Address, 720 = Read-only Data, 70

FIG. 8

| msb | x,y | Read-only Data |
|---|---|---|
| 0 | 00 | one |
| 0 | 01 | lg 10 |
| 0 | 10 | lg e |
| 0 | 11 | pi |
| 1 | 00 | log 2 |
| 1 | 01 | ln 2 |
| 1 | 10 | Zero |
| 1 | 11 | DC |

712 = msb, 714 = x,y, 720 = Read-only Data, 70

FIG. 11

| BITS 1-4 / BITS 0,5 | 0000 | 0001 | 0010 | 0011 | 0100 | 0101 | 0110 | 0111 |
|---|---|---|---|---|---|---|---|---|
| 00 | 1110 | 0100 | 1101 | 0001 | 0010 | 1111 | 1011 | 1000 |
| 01 | 0000 | 1111 | 0111 | 0100 | 1110 | 0010 | 1101 | 0001 |
| 10 | 0100 | 0001 | 1110 | 1000 | 1101 | 0110 | 0010 | 1011 |
| 11 | 1111 | 1100 | 1000 | 0010 | 0100 | 1001 | 0001 | 0111 |
|  | jijb | fneg | lpgm | cebi | ghmc | jkpj | mekn | kbdh |
|  | 1130 | 1132 | 1134 | 1136 | 1138 | 1140 | 1142 | 1144 |

| BITS 1-4 / BITS 0,5 | 1000 | 1001 | 1010 | 1011 | 1100 | 1101 | 1110 | 1111 |
|---|---|---|---|---|---|---|---|---|
| 00 | 0011 | 1010 | 0110 | 1100 | 0101 | 1001 | 0000 | 0111 |
| 01 | 1010 | 0110 | 1100 | 1011 | 1001 | 0101 | 0011 | 1000 |
| 10 | 1111 | 1100 | 1001 | 0111 | 0011 | 1010 | 0101 | 0000 |
| 11 | 0101 | 1011 | 0011 | 1110 | 1010 | 0000 | 0110 | 1101 |
|  | gdpl | lgmb | gmjd | n1hg | fidp | kecm | adfg | fjij |
|  | 1146 | 1148 | 1150 | 1152 | 1154 | 1156 | 1158 | 1160 |

1120

1110

1112  1114

SYSTEM AND METHOD FOR SMALL READ ONLY DATA

BACKGROUND OF THE INVENTION

1. Field of the Invention

The present invention relates to minimizing data retrieval time and/or area, or more particularly, to a system and method for minimizing read-only data retrieval time and/or area by using combinatorial logic to provide read-only data to a requester.

2. Description of Related Art

Electronic circuits typically operate in conjunction with at least one form of memory. For example, a personal computer generally includes a central processing unit (CPU) that operates in conjunction with random-access memory (RAM) and read-only memory (ROM)—the major difference being that RAM can both store and retrieve user defined data whereas ROM can only retrieve data established at the time of manufacture.

Typically, RAM is constructed by dividing a read/write portion of memory into discrete address bits, thus allowing data to be stored at, and retrieved from, a particular address location. For example, in response to a computer user providing a data-processing program (e.g., Word, Word Perfect, etc.) with the word "dog," the program might temporarily store the word in RAM at a particular address location (e.g., address one-thousand). If the document is subsequently printed, the program will retrieve the word "dog" from the previously stored address location (e.g., address one-thousand) and provide it to the designated printer.

As well, ROM, regardless of its limited use (in that it cannot store user provided data), is typically constructed in the same fashion. A read-only portion of memory is divided into discrete address bits to allow read-only data to be retrieved from a particular address location. For example, a Pentium processor, which uses load constant instructions, may retrieve these constants from a particular address location in ROM—these constants being established at known addresses in the ROM module at the time of manufacturing.

The benefit of similar construction is that all forms of data—both stored and manufacturer established (i.e., read-only) data—can be retrieved by merely providing the memory module with the address location at which the data is located. The disadvantage of using such a similar construction is that both memory modules take roughly the same amount of time to execute (i.e., roughly an entire clock cycle), and utilize the same amount of real estate to store a single bit of data. In other words, ROM, which is more simplistic (in terms of read/write) than RAM, takes approximately the same amount of time to execute an instruction (i.e., provide data), and uses the same amount of area (per bit), as RAM.

This becomes especially problematic when the read-only memory (ROM) is small in comparison to the random-access memory (RAM), because a relatively large amount of time (usually an entire clock cycle) is needed to differentiate between a relatively small amount of manufacturer established data (i.e., the read-only data stored in ROM). Thus it would be desirable to have a system and method that minimizes read-only data retrieval time and/or area for ROM devices.

SUMMARY OF THE INVENTION

The present invention provides a system and method for minimizing read-only data retrieval time through the use of combinatorial logic. One embodiment of the present invention is directed to a two-bit address system. In this embodiment, two address bits are provided to a binary logic function device. The binary logic function device uses the two address bits and predetermined logic functions (i.e., functions that represent a plurality of read-only data values) to produce binary values. The resulting binary value is the read-only data requested.

Another embodiment of the present invention is directed to a three-bit address system. In this embodiment, two of the address bits are used as in the first embodiment, with the binary values (resulting from the binary logic function device) being provided to a multiplexer. The multiplexer uses the remaining address bit to select which binary value is the read-only data that has been requested.

Another embodiment of the present invention is directed to a multi-bit address systems (e.g., a six-bit address systems). In this embodiment, the binary values (resulting from the binary logic device) are provided to at least one multiplexer (the number of multiplexers and/or their ratios being determined by the number of address bits available as well as the characteristics of the miltiplexers available to the designer). The multiplexer uses a portion of the remaining bits (i.e., the address bits not being provided to the binary logic function device) to select (or narrow down) which binary value is the read-only data that has been requested. These narrowed down values are then provided to at least one other multiplexer—where the remainder of the remaining bits are used to select which value is the read-only data that has been requested.

A more complete understanding of the system and method for minimizing read-only data retrieval time by using combinatorial logic will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 3 illustrates the binary value results of plugging the address combinations of FIG. 1 into the sixteen binary logic functions (i.e., a–q) of FIG. 2.

FIG. 4 provides an example of how the sixteen binary logic functions (i.e., a–q) depicted in FIG. 2 can be used to represent certain arithmetic values (i.e., 20, 32, 16, and 4).

FIG. 5 provides another example of how the sixteen binary logic functions (i.e., a–q) depicted in FIG. 2 can be used to represent certain arithmetic values (i.e., "one," "log base two of ten," "log base two of e," and "pi").

FIG. 6 provides another example of how the sixteen binary logic functions (i.e., a–q) depicted in FIG. 2 can be used to represent certain arithmetic values (i.e., "log base ten of two," "log base e of two," "zero," and "don't care").

FIG. 7 illustrates how a three-bit address system could be used to identify the eight arithmetic values illustrated in FIGS. 5 and 6.

FIG. 8 illustrates how the three-bit address system depicted in FIG. 7 could be rewritten as a two-bit address system with a most-significant bit (MSB).

FIG. 11 illustrates how the six-bit address system of FIG. 10 could be rewritten as a two-bit address system with four middle bits.

DETAILED DESCRIPTION OF THE PREFERRED EMBODIMENT

The present invention provides a system and method for minimizing read-only data retrieval time by using combinatorial logic to provide read-only data to a requester. In the detailed description that follows, like element numerals are used to describe like elements illustrated in one or more figures.

Figures 1, 2:
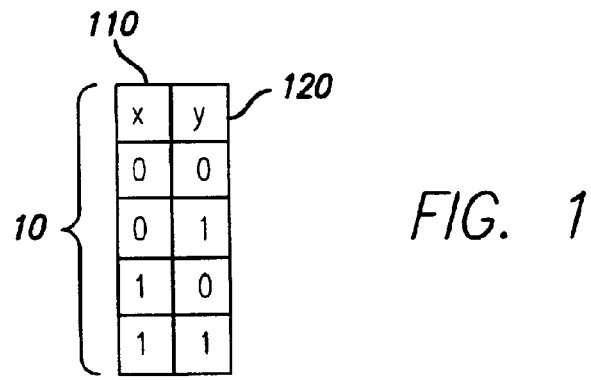
FIG. 1 depicts the address combinations of a two-bit address system.
FIG. 2 depicts sixteen binary logic functions (i.e., a–q) available for a two-bit address system.

Data is typically stored at address locations. A two-bit address system will first be described. FIG. 1 depicts a two-bit address system 10, which includes two address bits 110, 120 (i.e., x and y) that yield four address combinations (i.e., 00, 01, 10, and 11). Through the use of combinatorial logic, these two address bits 110, 120 (i.e., x and y) can be used to produce sixteen binary functions.

FIG. 2 illustrates the sixteen binary functions 220 in a binary function table 20—each one being represented by a separate and distinct reference character 210 (i.e., a–q). More particularly, the sixteen logic functions 220 are made up of (1) zero, (2) one, (3) x, (4) y, and (5) x and/or y operated on by a plurality of logical functions that include OR (represented through the use of "|"), AND (represented through the use of "&"), XOR (represented through the use of "^"), and NOT (represented through the use of "~") (which can be used to produce NOR, NAND, and XNOR). FIG. 3 shows the binary value results 30 of plugging the address combinations of FIG. 1 into the logic functions 220 of FIG. 2.

From FIGS. 2 and 3 it is clear that certain logic function results are independent of x 110 and y 120, whereas other logic function results are directly dependent on x 110 and/or y 120. For example, the logic function denoted by reference character "a" (i.e., function "0") produces a result of zero regardless of the value of x 110 or y 120. On the other hand, the logic function denoted by reference character "b" (i.e., function "x & y") produces a result of one only when x 110 and y 120 are both one. As another example, the logic function denoted by reference character "c" (i.e., function "x & (~y)") produces a result of one only when x 110 is one and y 120 is zero.

FIG. 4 shows how the these logic functions (denoted by "a–q") can be used to produce a desired result (e.g., read-only data). Specifically, two address bits 410 (i.e., x and y) are used to produce four address combinations (i.e., 00, 01, 10, and 11) and four corresponding read-only data 420 values (i.e., 20, 32, 16, and 4). It should be appreciated, however, that the specific read-only data values depicted in FIGS. 4–11 (e.g., 20, 32, log base ten of two, etc.) are used to illustrate particular embodiments of the present invention, and are not intended to further limit the present invention. Therefore, any read-only data values generally known to those skilled in the art are within the spirit and scope of the present invention.

Referring back to FIG. 4, each read-only data 420 value (i.e., 20, 32, 16, 4) can have a corresponding binary representation. For example, the base ten data value "20" can be represent by the binary (i.e., base two) value "010100," As well, the base ten data value "32" can be represented by the binary value "100000," and so on. The end result is four binary values 430 that can be expressed in functional form. For example, the most-significant bit (MSB) of each binary value is one only when x is zero and y is one. This is the same result as the logic function "e" (i.e., function "(~x) & y"), as depicted in FIGS. 2 and 3. Thus, the MSB of the four binary values can be represented by the logic function "e." Similarly, the next most-significant bit (NMSB) is one only when y is zero. This is the same result as the logic function "k" (i.e., function "~y"), as depicted in FIGS. 2 and 3. Thus, the NMSB of the four bit values can be represented by the logic function "k," and so on. By converting all six bits to logic functions, it becomes clear that the four binary values (and therefore the read-only data represented by these values) can be represented by the logic functions "ek-ajaa" 440. Once the logic functions 440 have been derived, combinatorial logic can be used to create a read-only memory system (see FIG. 9).

A similar method can be used to produce the results of the load constant instruction set (i.e., read-only data) for the Pentium processor. The instruction set for the Pentium processor includes seven read-only data values, namely: (1) one, (2) log base two of ten, (3) log base two of e, (4) pi, (5) log base ten of two, (6) log base e of two, and (7) zero. FIG. 5 depicts how two address bits 510 can be used to represent four (i.e., 520) of the seven read-only data values of the Pentium instruction set. More particularly, each read-only data 520 value can be represented in IEEE format—that is, through a sign bit 530, eight exponent bits 540 (which represent two to the one-twenty-seventh-minus EXP 540 power), and twenty-three fraction bits 560. The base number (BN 550) (also called the integer bit or the implicit bit) for each binary value defaults to one, and thus does not need to be represented by a bit. Thus, the read-only data 520 value "one" is represented by "1.0" (i.e., 550, 560) times two to the zero power (i.e., one-twenty-seven minus EXP 540), which equals "one." It should be appreciated, however, that the method depicted in FIG. 5 for representing fractional and/or exponential read-only data values (i.e., the IEEE format) is used merely to illustrate one embodiment of the present invention, and is not intended to further limit the invention. Therefore, any binary representation of read-only data is within the spirit and scope of the present invention.

Referring back to FIG. 5, each bit of the four thirty-two bit values can be analyzed to determine which logic function produces an equivalent result. For example, the sign bit 530 is zero regardless of the value of x and y. This is the same result as the logic function "a" (function "0"), as depicted in FIGS. 2 and 3. As well, the MSB of the exponent bits 540 is one whenever y is one. This is the same result as the logic function "f" (function "y"), as depicted in FIGS. 2 and 3. The end result of such an analysis is that all four binary values (and therefore the read-only data) can be represented by the logic functions "a-fkkk-kkkl-fcgd-eabg-aceh-bhbb-fghh-add" 570 (i.e., the first set of logic functions). It should be appreciated that any logic function that is specified more than once (e.g., "d," in the logic functions 570), only needs to be computed once for the result to be used in multiple positions.

Similarly, FIG. 6 depicts how two address bits 610 can be used to produce the remaining three (i.e., 620) of the seven read-only data values of the Pentium instruction set (as well as one don't care—"DC"). As with FIG. 5, a sign bit 630, eight exponent bits 640, and twenty-three fraction bits 660 are used to represent the read-only data 620 values. As previously shown, each bit of the four binary values can be analyzed to determine which logic function produces an equivalent result. After analyzing each bit, it is clear that all four binary values (and therefore the read-only data) can be represented by the logic functions "b-bnnn-nnnj-bfmi-aiea-emea-aeai-aamm-aii" 670 (i.e., the second set of logic functions). Therefore, it is clear that two two-bit address systems (i.e., FIGS. 5 and 6) can be used to produce the entire set of constants provided in the Pentium instruction set.

In order for a single system to produce the entire set of constants provided in the instruction set, that system would have to produce seven read-only data values. The number of read-only data values available for a k-bit address system is represent by $2^k$. In other words, a two-bit address system results in $2^2$ (or four) read-only data values; a three-bit address system results in $2^3$ (or eight) read-only data values; and so on. Therefore, in order to represent the seven read-only data values of the Pentium instruction set, a three-bit address system is needed.

FIG. 7 depicts a three-bit address system 70 capable of providing the eight read-only data 720 values of the Pentium instruction set. More particularly, the first four addresses (i.e., 000–011) correspond to the read-only data values depicted in FIG. 5, and the last four addresses (i.e., 100–111) correspond to the read-only data values depicted in FIG. 6. The similarity between FIG. 7 and FIGS. 5 and 6 is perhaps better show in FIG. 8, where the most-significant bit (MSB) has been separated from the rest of the address—in essence rewriting the three-bit address in one-bit-followed-by-two-bit address form.

By representing the three-bit address system in this fashion, it become clear that the MSB is used to select between the first four read-only data values and the last four read-only data values. For example, referring to FIG. 8, a zero for both x and y indicates either a read-only data value of one or log base ten of two—the only difference being the value of the MSB. Therefore, depending on the MSB, the requester will either be provided with read-only data representing "one" or read-only data representing "log base ten of two"—or in functional terms, the requester will either be provided with the result of the first set of logic functions (i.e., see FIG. 5, "a-fkkk-kkkl-fcgd-eabg-aceh-bhbb-fghh-add" 570) or the result of the second set of logic functions (i.e., see FIG. 6, "bbnnn-nnnj-bfmi-aiea-emea-aeai-aamm-aii" 670).

Figures 9, 10:
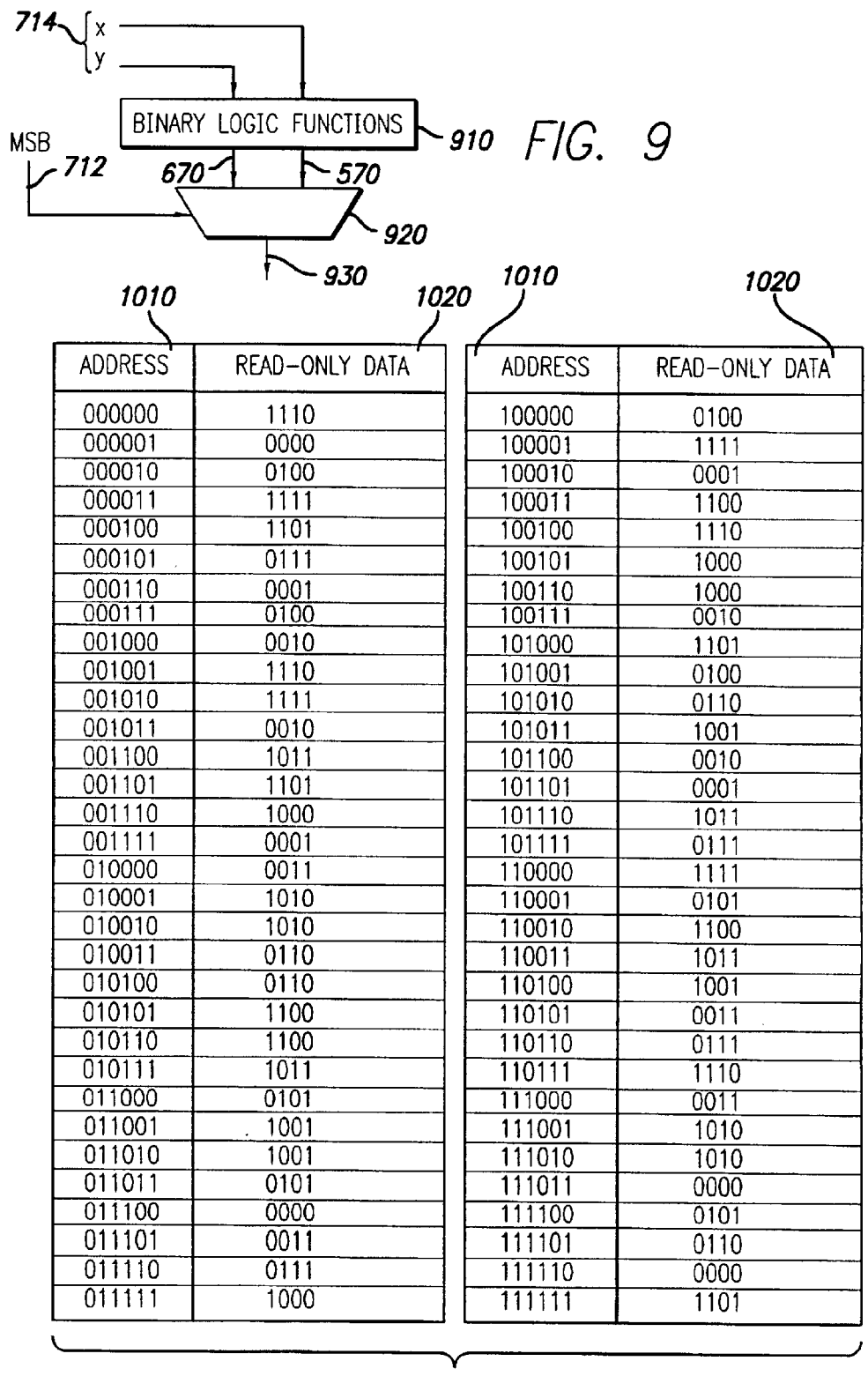
FIG. 9 depicts one embodiment of the present invention that provides read-only data through the use of combinatorial logic.
FIG. 10 illustrates a six-bit address system.

FIG. 9 depicts an embodiment of the present invention that utilizes combinatorial logic to produce the read-only data depicted in FIG. 8. More particularly, a binary logic function device 910 is used, along with a multiplexer 920, to produce a specified read-only data value 930. Specifically, two address bits 714 (i.e., x and y) are provided to the binary logic function device 910. The binary logic function device 910 uses the two address bits 714 and predetermined logic functions (i.e., the functions that make up the first and second set of logic functions 570, 670) to produce binary values. The binary values are then provided to a multiplexer 920. The multiplexer 920, in turn, uses the MSB to select which binary value is actually provided to the requester. It should be appreciated that the term requester is being used in its broad sense, and any person, program, circuit, or device requesting read-only data is within the spirit and scope of the present invention. Furthermore, it should be appreciated that the multiplexer 920 depicted in FIG. 9 is not required to practice the present invention, and is only needed in a three-bit (or more) address system. For example, a multiplexer is not needed to produce the read-only data depicted in FIG. 4 (i.e., a two-bit address system).

It should be appreciated, however, that the present invention is not limited to a three-address system. For example, as depicted in FIG. 10, a DES encryption algorithm utilizes a six-bit address system for providing sixty-four read-only memory values. FIG. 11 depicts how this six-bit address system can be rewritten in two-bit address form. More particularly, two of the six bits (e.g., bits "0" and "5") (the particular two being of no significance) are mapped on one axis, and the remaining bits (e.g., bits "1–4") are mapped on the other axis. This allows the read-only data values to be represented by logic functions. For example, when bits "1–4" are 0000, the read-only data values are either 1110, 0000, 0100, or 1111, depending on the value of bits "0" and "5." Thus, the MSB of these values is one whenever both x and y are both one or both zero. This is the same result as the logic function "j" (i.e., function "~(x ^ y)"). This process can be continued to determine that the four bit values (and therefore the read-only data) is represented by the logic functions of "jljb" 1130. By doing this for the entire six-bit address system, a series of logic functions (i.e., 1130–1160) representing the read-only data values can be produced.

Figure 12:
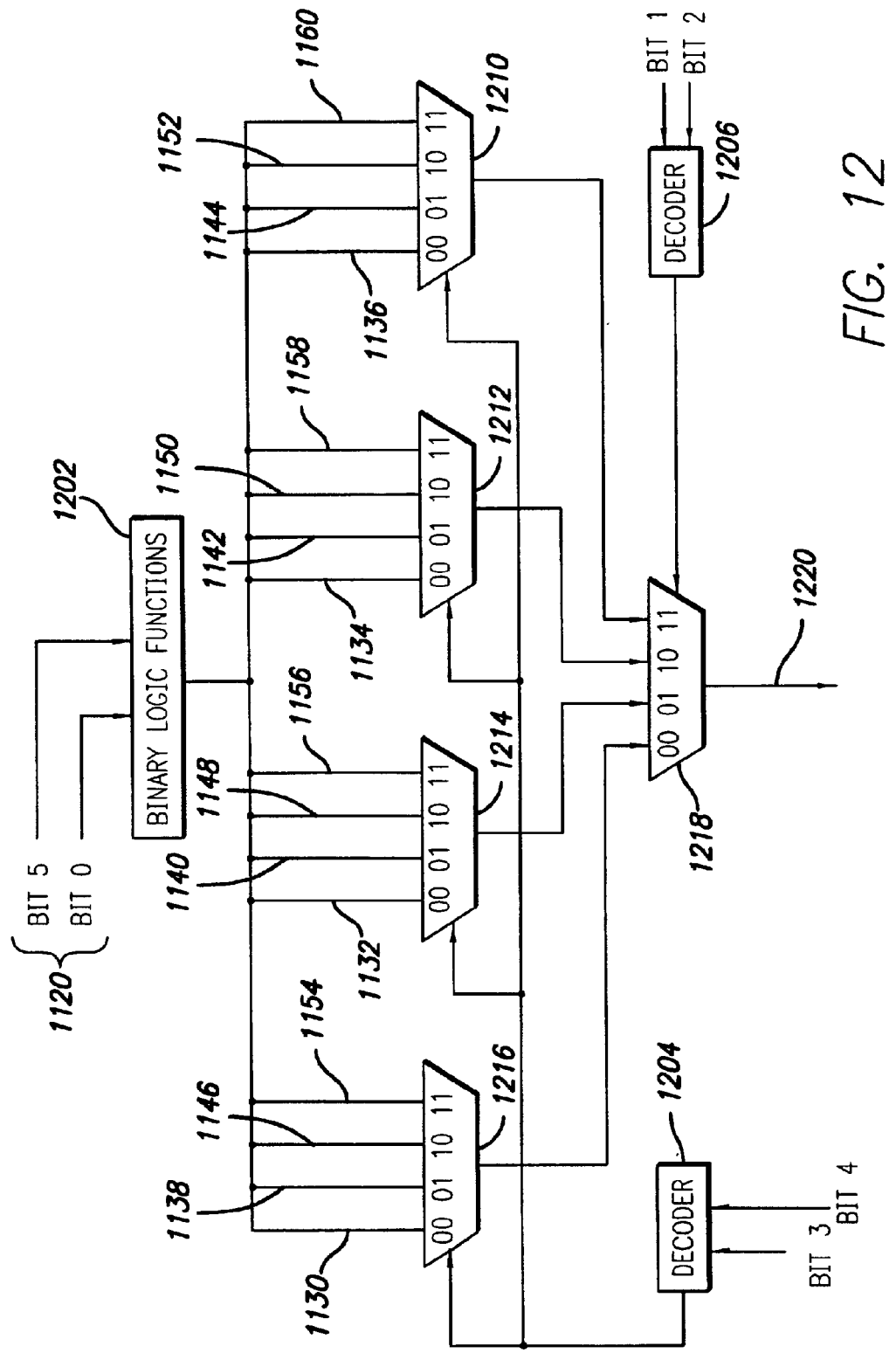
FIG. 12 depicts another embodiment of the present invention that provides read-only data through the use of combinatorial logic.

FIG. 12 depicts an embodiment of the present invention that utilizes combinatorial logic to produce the read-only data depicted in FIG. 11. More particularly, a binary logic function device 1202 is used, along with a plurality of multiplexers 1210–1218, to produce a specified read-only data value 1220. Specifically, two address bits 1120 (i.e., bits "0" and "5") are provided to the binary logic function device 1202. The binary logic function device uses the two address bits 1120 and predetermined logic functions (i.e., the logic function 1130–1160) to produce binary values. The binary values are then provided to the four multiplexers 1210–1216. Address bits "3–4", which are first decoded through a decoder 1204, are provided to the four multiplexers 1210–1216 to determine (or select) which set of binary values are provided to a fifth multiplexer 1218. Address bits "1–2", which are first decoded through a decoder 1206, are provided to the fifth multiplexer 1218 to determine (or select) which binary value is the read-only data requested (i.e., 1220). It should be appreciated that the number of multiplexers 1210–1218 depicted in FIG. 12 is not intended to limit the present invention, but merely to illustrate one embodiment of the present invention. Furthermore, it should be appreciated that the predetermined logic functions do not necessarily include every logic function depicted in FIG. 2. Utilizing only a subset of the logic functions depicted in FIG. 2 is considered within the spirit and scope of the present invention.

Having thus described a preferred embodiment of a system and method for minimizing read-only data retrieval time through the use of combinatorial logic, it should be apparent to those skilled in the art that certain advantages of the system have been achieve. It should also be appreciated that various modifications, adaptations, and alternative embodiments thereof may be made within the scope and spirit of the present invention. The invention is further defined by the following claims.

What is claimed is:

1. A read-only memory system where read-only data is stored in combinatorial logic, said system comprising:
    at least one binary logic function device adapted to receive two binary address bits, and to generate a plurality of binary values from (i) said two address bits and (ii) a plurality of logic functions;
    at least one multiplexer adapted to receive at least one of said plurality of binary values, said at least one multiplexer being adapted to select a subset of said at least one of said plurality of binary values based upon at least one other address bit, said at least one other address bit being separate and distinct from said two address bits;
    at least one decoder for decoding said at least one other address bit; and
    at least one other multiplexer, where the output of said at least one multiplexer is provided to said at least one other multiplexer, the output of said at least one other multiplexer being said read-only data.

2. A read-only memory system where read-only data is stored in combinatorial logic, said system comprising:
    at least one binary logic function device adapted to receive two binary address bits and to generate a plurality of binary values from (i) said two address bits and (ii) a plurality of logic functions;
    at least one multiplexer adapted to receive at least one of said plurality of binary values;
    at least one decoder for decoding at least one other address bit; and
    at least one other multiplexer, where the output of said at least one multiplexer is provided to said at least one other multiplexer, the output of said at least one other multiplexer being said read-only data.

* * * * *